(12) United States Patent
Yokoyama

(10) Patent No.: US 6,795,479 B2
(45) Date of Patent: Sep. 21, 2004

(54) GENERATION OF OPTICAL PULSE TRAIN HAVING HIGH REPETITION RATE USING MODE-LOCKED LASER

(75) Inventor: Hiroyuki Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/191,497

(22) Filed: Jul. 10, 2002

(65) Prior Publication Data

US 2003/0012235 A1 Jan. 16, 2003

(30) Foreign Application Priority Data

Jul. 12, 2001 (JP) ........................................ 2001-211682

(51) Int. Cl.$^7$ .............................................. H01S 3/082
(52) U.S. Cl. ............................ 372/97; 372/25; 372/92
(58) Field of Search .............................. 372/25, 92, 97, 372/69; 359/187, 327, 326, 332

(56) References Cited

U.S. PATENT DOCUMENTS

| | | | | |
|---|---|---|---|---|
| 5,072,135 A | * | 12/1991 | Huignard et al. | ........... 359/327 |
| 5,406,577 A | * | 4/1995 | Gagosz | .......................... 372/69 |
| 5,586,138 A | * | 12/1996 | Yokoyama | ................... 372/97 |
| 5,946,129 A | * | 8/1999 | Xu et al. | ..................... 359/332 |
| 6,031,851 A | | 2/2000 | Shimizu et al. | |
| 6,130,900 A | * | 10/2000 | Black et al. | ................... 372/25 |
| 6,249,371 B1 | * | 6/2001 | Masuda et al. | ............. 359/326 |
| 6,445,478 B2 | * | 9/2002 | Shimizu et al. | ............. 359/187 |

FOREIGN PATENT DOCUMENTS

JP          8-148749 A     6/1996

* cited by examiner

Primary Examiner—Don Wong
Assistant Examiner—Leith Al-Nazer
(74) Attorney, Agent, or Firm—Sughrue Mion, PLLC

(57) ABSTRACT

An optical pulse train generator is composed of first and second optical resonators and an optical pulse generator. The first optical resonator has therein a first optical path of a first optical path length. The second optical resonator is inserted into the first optical path. The second optical resonator has therein a second optical path of a second optical path length substantially equal to 1/m of the second optical path length, m being a natural number. The optical pulse generator provides the first optical resonator with a first optical pulse train including a component of a first repetition rate tuned corresponding to the first optical path length. The provision of the first optical pulses allows a second optical pulse isolator to be generated in the first optical resonator. The first optical resonator extracts a portion of the second optical pulse train to output an output optical pulse train.

18 Claims, 6 Drawing Sheets

GENERATION OF OPTICAL PULSE TRAIN HAVING HIGH REPETITION RATE USING MODE-LOCKED LASER

BACKGROUND OF THE INVENTION

1. Field of the Invention

The present invention relates to generation of optical pulse trains, and in particular to an apparatus and method for generating an optical pulse train having a high repetition rate.

2. Description of the Related Art

Optical telecommunications systems and optical computers often require optical pulse trains having a high repetition rate.

Modulated mode-locked semiconductor lasers have been recognized as sources of optical pulse trains having a high repetition rate. A modulated mode-locked semiconductor laser is disclosed in U.S. Pat. No. 6,031,851, which is incorporated herein by reference in its entirety. FIG. 1 is a schematic of the conventional modulated mode-locked semiconductor laser. The conventional modulated mode-locked semiconductor laser is composed of a substrate 55, an active region 56 and electrodes 57–59. The substrate 55 and active region 56 are divided into a distributed Bragg reflector section (DBR section) 51, an electroabsorption modulator section 52, a gain section 53 and a saturable absorber section 54.

Generation of an optical pulse train is achieved by using the conventional modulated mode-locked semiconductor laser as described in the following. The saturable absorber section 54 is provided with a reverse bias voltage through the electrode 57. The gain section 53 is provided with a dc current through the electrode 58. The electroabsorption modulator section 52 is provided with a modulation bias through the electrode 59, the modulation bias being generated by superposition of a reverse dc bias voltage and a sinusoidal voltage. The modulation bias causes an optical pulse train to be emitted. The conventional modulated mode-locked semiconductor laser can generate an optical pulse train having a repetition rate in the range from 30 to 40 GHz.

Generation of optical pulse trains is also achieved by using an array waveguide diffraction grating (AWG) or a Fabry-Perot etalon. FIG. 2 shows an AWG apparatus 71 for generating an optical pulse train. The AWG apparatus 71 is composed of an input waveguide 61, an optical demultiplexer 62, a plurality of waveguides 63, an optical multiplexer 64, and an output waveguide 65. The optical path lengths of the plurality of waveguides 63 are different from each other. The input waveguide 61 is provided with an optical pulse train Pin as shown in FIG. 3A. As shown in FIG. 2, the optical pulse train Pin is demultiplexed by the optical demultiplexer 62 to generate a plurality of be optical pulse trains. The generated optical pulse trains are respectively supplied to the waveguides 63 to be delayed. The different optical path lengths of the waveguides 63 causes the optical pulse trains to be delayed by different delay times. The delayed optical pulse trains are multiplexed by the multiplexer 64 to generate an output optical pulse train Pout. The output optical pulse train Pout has a repetition rate m times that of the input optical pulse train Pin, N being the number of the waveguides 63.

Yokoyama et al. disclose still another technique for generating optical pulse trains in Japanese Laid Open Patent Application (Jp-A Heisei 8-148749). The optical pulse train generating technique uses two semiconductor lasers, one of which is a modulated mode-locked semiconductor laser, and the other is a passive mode-locked semiconductor laser. The modulated mode-locked semiconductor laser generates an optical pulse train to excite the passive mode-locked semiconductor laser. The passive mode-locked semiconductor laser generates an output optical pulse train in synchronization with the optical pulse train from the modulated mode-locked semiconductor laser. The synchronization achieved by the optical excitation improves the stability of the repetition rate of the output optical pulse train.

Resent development of optical signal processing increases a demand of generation of optical pulse trains having a repetition rate higher than 50 GHz, desirably higher than 80 GHz, while the repetition rate is precisely controlled. A technique enabling the generation of optical pulse trains having precisely controlled high repetition rates has been desired.

SUMMARY OF THE INVENTION

Therefore, an object of the present invention is to provide an optical pulse train generator for generating optical pulse trains having high repetition rates.

Another object of the present invention is to provide an optical pulse train generator for precisely controlling a repetition rate of a generated optical pulse train.

An optical pulse train generator includes first and second optical resonators and an optical pulse generator. The first optical resonator has therein a first optical path of a first optical path length. The second optical resonator is inserted into the first optical path. The second optical resonator has therein a second optical path of a second optical path length substantially equal to 1/m of the second optical path length, m being a natural number. The optical pulse generator provides the first optical resonator with a first optical pulse train including a component of a first repetition rate tuned corresponding to the first optical path length. The provision of the first optical pulse train allows a second optical pulse train to be generated in the first optical resonator. The first optical resonator extracts a portion of the second optical pulse train to output an output optical pulse train.

When the optical pulse train generator further includes a laser gain element inserted into the first optical path of the first optical resonator, the laser gain element preferably receives the first optical pulse train for amplifying the second optical pulse train in synchronization with the first optical pulse train.

The laser gain element is preferably a mode-locked semiconductor laser including a saturable absorber region receiving the first optical pulse train, and a gain region coupled to the saturable absorber region to amplify the second optical pulse train.

It is preferable that the mode-locked semiconductor laser has a reflecting surface on the saturable absorber region, and the first optical resonator includes a reflecting mirror, the first optical path being formed between the reflecting surface and the mirror through the gain region and the second optical resonator.

The reflecting mirror is preferably movable to enable to adjust the first optical path length.

The first optical resonator may be formed of a Fabry-Perot resonator having a pair of reflecting surfaces between which the first optical path is formed, In this case, the first repetition rate of the first optical pulse train is preferably f/n, n being a natural number and f being a circumferential frequency defined by:

$$f=c/2L,$$

where c is the velocity of light in vacuum, and L is the first optical path length of the first optical path between the pair of reflecting surface. This causes the second repetition rate of the second optical pulse train to be m times the circumferential frequency f.

The second optical resonator may be formed of a Fabry-Perot etalon including a pair of optical flats between which the second optical path is formed.

In this case, the Fabry-Perot resonator and the Fabry-Perot etalon are preferably designed not to form a resonator between the Fabry-Perot resonator and the Fabry-Perot etalon. This is preferably achieved by that the pair of optical flats is oblique to the first optical path formed between the pair of reflecting mirrors of the Fabry-Perot resonator.

The first optical resonator may be formed of a ring resonator, the first optical path of the first optical resonator being looped.

In this case, the first repetition rate of the first optical pulse train is preferably f'/n, n being a natural number and f' being a circumferential frequency defined by:

$$f'=c/L,$$

where c is the velocity of light in vacuum, and L is the first optical path length of the looped first optical path. This causes the second repetition rate of the second optical pulse train to be m times the circumferential frequency f'.

The first optical resonator may include an optical fiber to form the ring resonator.

The second optical resonator may be formed of a Fabry-Perot etalon, while the first optical resonator is formed of a ring resonator.

When the first optical resonator is formed of a ring resonator, the second optical resonator may be formed of another ring resonator, the second optical path of the second optical resonator being looped.

The second optical resonator includes another optical fiber to form the other ring resonator.

The first and second optical path lengths of the first and second optical resonators are preferably adjustable.

DESCRIPTION OF THE PREFERRED EMBODIMENTS

An optical pulse train generator according to the present invention will be described below in detail with reference to the attached drawings.

First Embodiment

Figure 1:
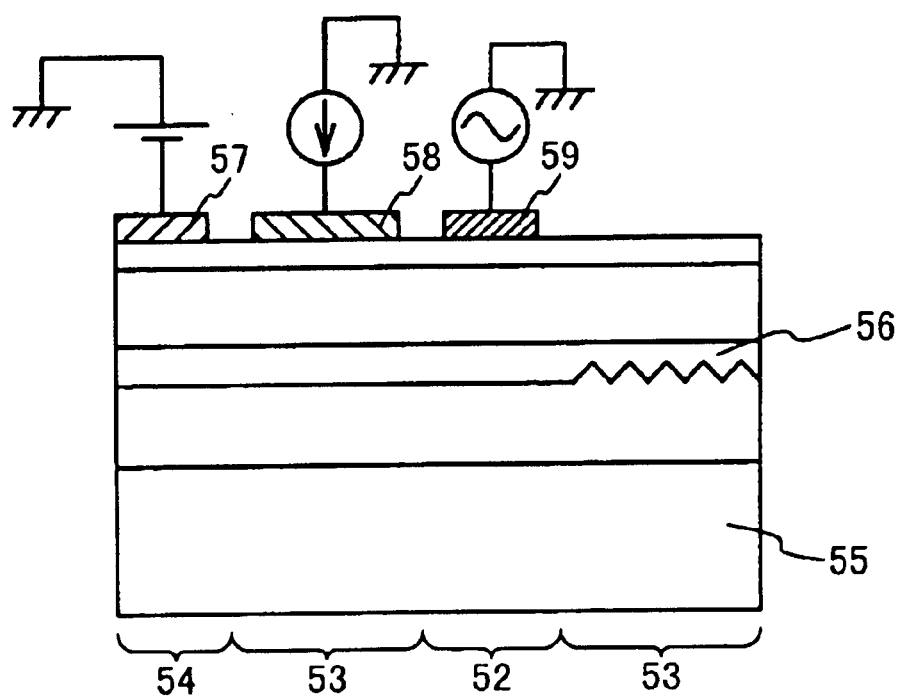
FIG. 1 is a section view showing a conventional modulated mode-locked semiconductor laser.
Figure 2:
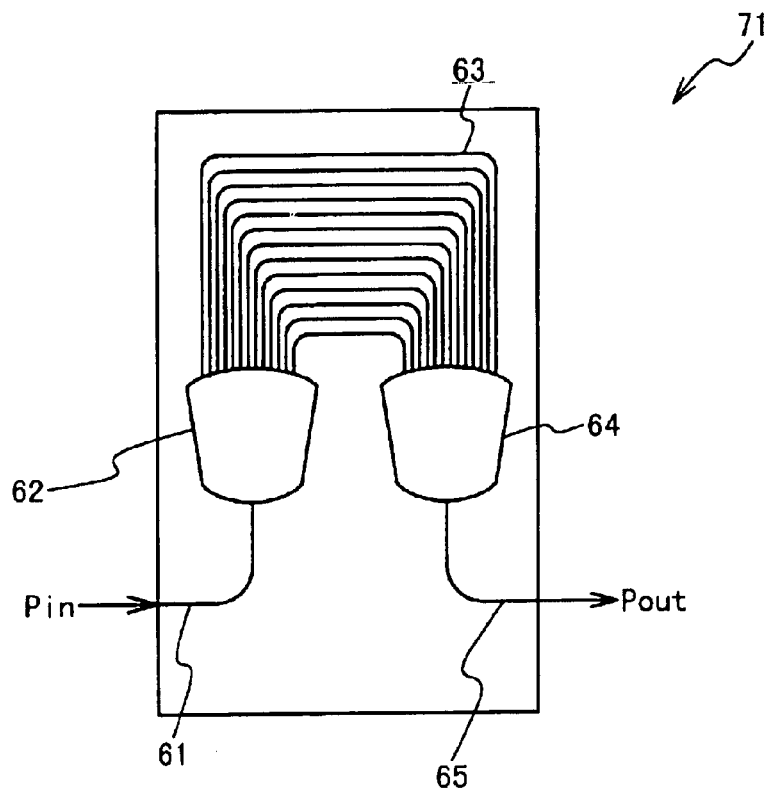
FIG. 2 is a conventional AWG apparatus for generating an optical pulse train.
Figure 3:
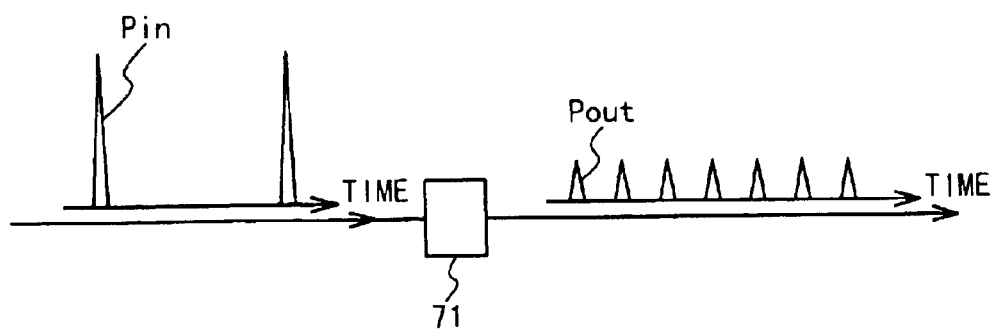
FIG. 3 shows an input optical pulse train Pin inputted to the conventional AWG apparatus, and an output optical pulse train Pout outputted from the conventional AWG apparatus.

An optical pulse train generator of a first embodiment is composed of an optical pulse source 6 and a mode-locked laser 12. The optical pulse source 6 provides a modulating optical pulse train 13 for the mode-locked laser 12 through an optical isolator 7 and a collimating lens 5*b*. The optical isolator 7 prevents an undesirable feed back from the mode-locked laser 12. It should be noted that the modulating optical pulse train 13 might be transmitted through an optical fiber (not shown). The optical pulse source 6 may be a passively mode-locked semiconductor laser, a DFB semiconductor laser, and a modulated mode-locked semiconductor laser. In this embodiment, the modulated mode-locked semiconductor laser shown in FIG. 1 is used as the optical pulse source 6. The modulated mode-locked semiconductor laser allows the mode interval thereof to coincide with the clock frequency because of the short resonator length thereof. This enables to reduce jitters of the modulating optical pulse train 13.

The mode-locked laser 12 is composed of a semiconductor laser 1, a semi-transparent mirror 2, a Fabry-Perot etalon 3, a wavelength selector 4, and a collimating lens 5. The Fabry-Perot etalon 3, the wavelength selector 4, and the collimating lens 5 are disposed in series between the semiconductor laser 1 and the semi-transparent mirror 2.

The semiconductor laser 1 has a reflective end surface 11*a* on the opposite side of the semi-transparent mirror 2. The reflective end surface 11*a* and the semi-transparent mirror 2 functions as a Fabry-Perot resonator. The Fabry-Perot resonator is referred to as a main resonator hereinafter. The reflective end surface 11*a* is coated with layer-structured dielectric films to increase the reflectivity thereof up to about 0.8. The layer-structured dielectric films may be formed of $SiO_2/TiO_2$ layers or $Si/SiO_2$ layers.

The opposite end surface 11*b* of the semiconductor laser 1 is coated with an antireflection coating. The antireflection coating may include layer-structured dielectric films such as $SiO_2/TiO_2$ layers and $Si/SiO_2$ layers. The reflectivity of the end surface 11*b* is decreased below $10^{-4}$. The low reflectivity of the end surface 11*b* prevents formation of a resonator between the end surface 11*b* and the semi-transparent mirror 2.

The semiconductor laser 1 includes a gain section 1*a* on the end surface 11*b*, and a saturable absorber section 1*b* on the end surface 11*a*. The gain section 1*a* and the saturable absorber section 1*b* are respectively provided with electrodes for electric power supply.

The gain section 1*a*, which functions as an optical amplifier, is supplied with a dc current to generate a resonated optical pulse train 14 inside the main resonator formed between the end surface 11*b* and the semi-transparent mirror 2. The saturable absorber section 1*b* receives the optical pulse train 13 from the optical pulse source 6 to synchronize the resonated optical pulse train 14 with the optical pulse train 13.

Figure 4:
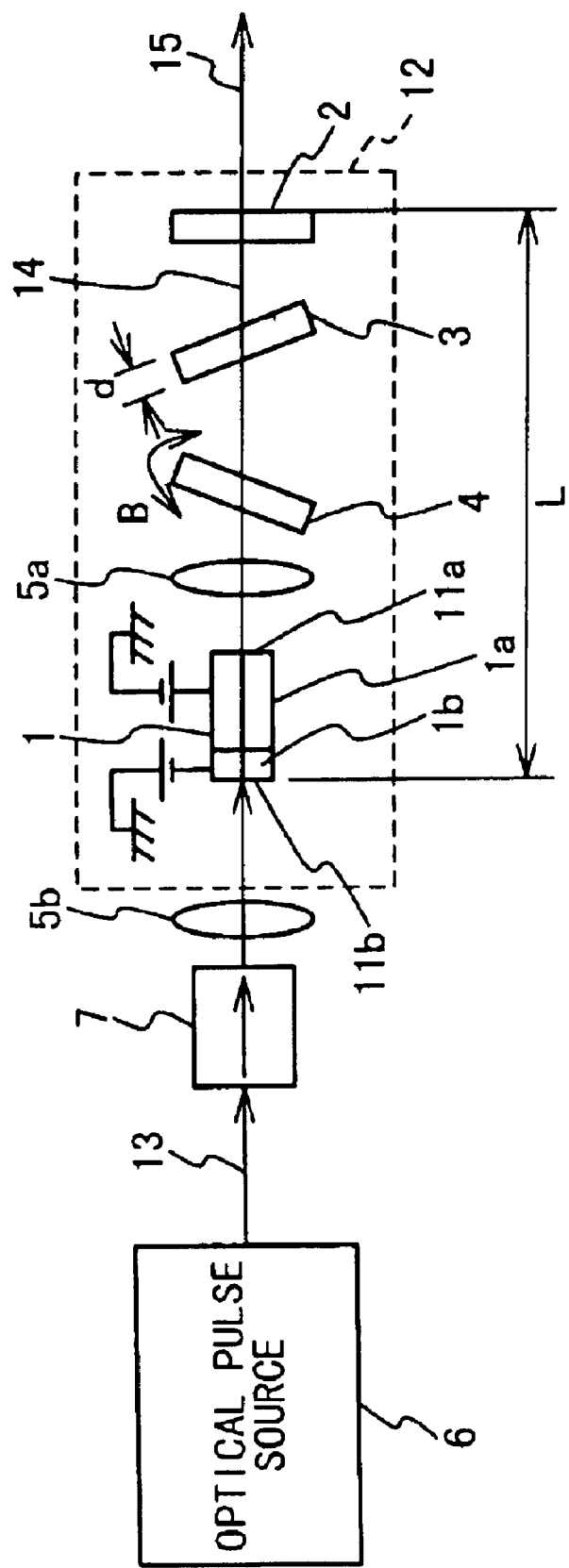
FIG. 4 is a schematic view showing an optical pulse generator of a first embodiment of the present invention.

The semi-transparent mirror 2 passes a portion of the resonated optical pulse train 14 to output an output optical pulse train 15. As indicated by an arrow A in FIG. 4, the semi-transparent mirror 2 is movable along the optical path of the main resonator. The movable semi-transparent mirror 2 allows the optical path length L of the main resonator to be adjusted to a desirable length. It should be noted that the optical path length L of the main resonator implies an optical path length between the reflective end surface 11*b* of the semiconductor laser 1 and the semi-reflective surface of the semi-transparent mirror 2. The movable semi-transparent mirror 2 enables to adjust a repetition rate of the output optical pulse train 15, precisely.

The Fabry-Perot etalon 3 functions as a sub-resonator inserted into the optical path of the main resonator. The Fabry-Perot etalon 3 is composed of a pair of parallel semi-reflective surfaces. In detail, the Fabry-Perot etalon 3 includes an optical flat formed of quartz, optical glass and the like, and a pair of semi-reflective layers formed on the both sides of the optical flat. The semi-reflective layers may be formed of layer-structured dielectric layers or of thin metallic films. The Fabry-Perot etalon 3 is designed to have the optical path length d between the parallel semi-reflective surfaces thereof defined as the following:

$$d=L/m,$$

where L is the optical path length of the main resonator, and m is an integer equal to or more than 2. The repetition rates at which the transmission coefficient of the resonated optical pulse train 14 is maximum have an interval $\Delta f$ of $c/2d$, where c is the velocity of light in vacuum.

The Fabry-Perot etalon 3 is arranged to be slightly slanting to the optical path of the main resonator. The slanting arrangement of the Fabry-Perot etalon 3 prevents formation of a resonator between the semi-transparent mirror 2 and the Fabry-Perot etalon 3, and between the Fabry-Perot etalon 3 and the end surfaces 11b of the semiconductor laser 1.

The Fabry-Perot etalon 3 may include a pair of semi-transparent parallel mirrors and an optical medium made with piezoelectric material or electrooptic material inserted between the semi-transparent parallel mirrors. The use of the piezoelectric or electrooptic optical medium allows the optical path length d between the semi-transparent parallel mirrors to be adjustable in response to voltages applied to the optical medium.

The wavelength selector 4 determines the wavelength of the resonated optical pulse train 14, and thus determines the wavelength of the output optical pulse train 15. The wavelength selector 4 may be a dispersing prism, a diffraction grating or a wavelength selecting filter composed of layer-structured dielectric layers. The wavelength of the output optical pulse train 15 can be set to a desired wavelength by adjusting the angle between the wavelength selector 4 and the optical path of the main resonator. The wavelength selector 4 allows the wavelength of the output optical pulse train 15 to be different from that of the synchronizing optical pulse 13. The wavelength selector 4 may be omitted if the precise control of the wavelength of the output optical pulse train 15 is not required. However, the use of the wavelength selector 4 is preferable for an actual use.

The optical pulse train generator of the first embodiment can generate the output optical pulse train 15 having a repetition rate m times that of the modulating optical pulse train 13. The mechanism of the generation of the output optical pulse train 15 is as follows.

The optical pulse source 6, which is the modulated mode-locked semiconductor laser shown in FIG. 1, generates the modulating optical pulse train 13. The repetition rate of the modulating optical pulse train 13 is tuned corresponding to the optical path length of the main resonator. In detail, the modulating optical pulse train 13 has a fundamental repetition rate of f/n, f being a circumferential frequency determined by:

$$f=c/2L,$$

and n being a natural number, where c is the velocity of light in vacuum and L is the optical path length of the main resonator. The generation of the modulating optical pulse train 13 is achieved by supplying a sinusoidal voltage of a frequency of f/n for the modulated mode-locked semiconductor laser by using a standard signal generator (not shown). The sinusoidal voltage causes the optical pulse source 6 to generate the modulating optical pulse train 13 having a fundamental repetition rate of f/n. The modulating optical pulse train 13 also includes harmonic components having a repetition rate of 2f/n, 3f/n, ..., f, ... The generated modulating optical pulse train 13 is inputted to the semiconductor laser 1 through the end surface 11b.

The gain section 1a of the semiconductor laser 1 is supplied with a dc current, and the saturable absorber section 1b is supplied with a reversed bias. The supply of the dc current and reversed bias causes the semiconductor laser 1 to generate the resonated optical pulse train 14 in the main resonator through passive mode locking.

The Fabry-Perot etalon 3, which functions as the sub-resonator having the optical path length of d (=L/m), limits the resonance modes of the resonated optical pulse train 14 to resonance modes satisfying the resonance condition determined by the arrangement of the Fabry-Perot etalon 3. The Fabry-Perot etalon 3 causes the resonated optical pulse train 14 to have a high repetition rate of m times the circumferential frequency f of the main resonator.

The semiconductor laser 1 receives the modulating optical pulse train 13 by the saturable absorption section 1b to modulate the resonated optical pulse train 14 in synchronization with the modulating optical pulse train 13. The fundamental repetition rate f/n of the modulating optical pulse train 13 and the harmonics thereof enables to precisely control the repetition rate of the resonated optical pulse train 14 to that m times the circumferential frequency f. The semi-transparent mirror 2 partially transmits the resonated optical pulse train 14 to generate the output optical pulse train 15. Thus, the mode-locked laser 12 can generate the output optical pulse train 15 having a high repetition rate in synchronization with the modulating optical pulse train 13 while the repetition rate is stabilized and precisely controlled.

The Fabry-Perot etalon 3 may causes a loss of the resonated optical pulse train 14 by its undesirable reflection and radiation. However, the loss is compensated by the semiconductor laser 1, which is used as a laser gain element disposed inside the main resonator, and thus the loss imposes no serious problem on the generation of the output optical pulse train 15.

Rather, the compensation by the semiconductor laser 1 enables to reduce the noise and to narrow the pulse width of the output pulse train 15. The gain section 1a of the semiconductor laser 1 amplifies and reproduces the resonated optical pulse train 14. The saturable absorber section 1b absorbs spontaneously emitted light to remove the background noise from the resonated optical pulse train 14. The saturable absorber section 1b also narrows the resonated optical pulse train 14. Therefore, the noise of the output optical pulse train 15 is reduced, and the pulse width of the output optical pulse train 15 is narrowed.

It must be understood that the optical pulse train generator of the first embodiment may be modified in the details. For example, the wavelength selector 4 may be incorporated into another component of the optical pulse train generator. For instance a diffused Bragg reflector used for wavelength selector 4 may be monolithically integrated in the semiconductor laser 1 such that the diffused Bragg reflector is adjacent to the gain section 1a. Also, the semi-transparent mirror 2 may be replaced with a diffraction grating that functions as the wavelength selector as well as one of the reflecting mirrors of the main resonator.

The transmission of the resonated optical pulse train 14 between the semiconductor laser 1 and the semi-transparent mirror 2 may be achieved by an optical fiber, a waveguide or a transparent medium made with other solid optical material. The use of an optical fiber for the transmission of the resonated optical pulse train 14 may be accompanied with a modification of the optical pulse train generator described in the following. The semi-transparent mirror 2 is replaced with a semi-reflecting film formed on an end of the optical fiber on the opposite side of the semiconductor laser 1. The semi-reflecting film is used for one of the reflector of the main resonator. The Fabry-Perot etalon 3, the wavelength selector 4 and the collimating lens is disposed between the optical fiber and the semiconductor laser 1. It is preferable that the other end of the optical fiber is obliquely cut to avoid the undesirable formation of a resonator.

The use of a semiconductor waveguide for the transmission of the resonated optical pulse train 14 may be accompanied with monolithically integration of the optical pulse train generator on a semiconductor substrate.

The use of a waveguide made with optical material such as quartz and lithium niobate may be accompanied with that all the components of the optical pulse train generator, such as the optical pulse source 6, the semiconductor laser 1, the Fabry-Perot etalon 3 and the wavelength selector 4, are incorporated on a silicon platform to form a module structure.

Second Embodiment

Figure 5:
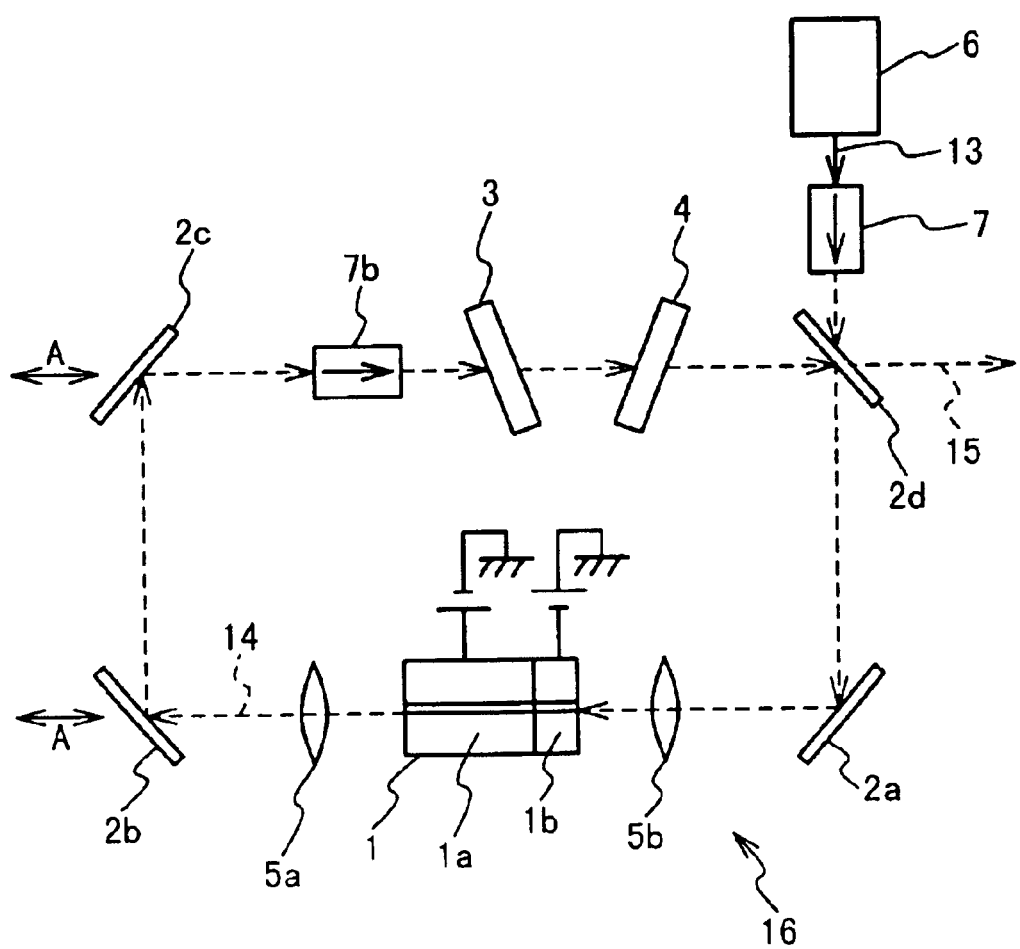
FIG. 5 is a schematic view showing an optical pulse generator of a second embodiment.

FIG. 5 shows an optical pulse train generator of a second embodiment.

The optical pulse train generator of the second embodiment is composed of an optical pulse source 6 and a mode-locked laser 16. The optical pulse source 6 is formed of the modulated mode-locked locked semiconductor laser shown in FIG. 1. The optical pulse source 6 provides a modulating optical pulse train 13 for the mode-locked laser 16 through an optical isolator 7.

The mode-locked laser 16 includes reflecting mirrors 2a, 2b, and 2c, and a semi-transparent mirror 2d to form therein a looped optical path. That is, the reflecting mirrors 2a, 2b, and 2c, and the semi-transparent mirror 2d form a ring resonator. The ring resonator is used for a main resonator in the mode-locked laser 16. The looped optical path of the ring resonator has an optical path length of L. The reflecting mirrors 2b and 2c are movable in directions indicated by arrows A shown in the FIG. 5. The movable mirrors 2b and 2c allow the optical path length L to be adjustable.

A collimating lens 5b, a semiconductor laser 1 and a collimating lens 5a are inserted in series between the reflecting mirrors 2a and 2b. The semiconductor laser 1, which includes a saturable absorber section 1b and a gain section 1a, has an almost same structure as that explained in the first embodiment, except that the both ends thereof are respectively coated with antireflection coatings. The antireflection coatings prevent formation of a resonator between the ends of the semiconductor laser 1.

An optical isolator 7 and a Fabry-Perot etalon 3 are inserted in series between the reflecting mirror 2c and the semi-transparent mirror 2d. The optical isolator 7 prevent an optical signal from being transmitted counterclockwise in the ring resonator.

The Fabry-Perot etalon 3 is used for a sub-resonator inserted into the main resonator (the ring resonator). The Fabry-Perot etalon 3 has the same structure as that explained in the first embodiment. The Fabry-Perot etalon 3 has a pair of semi-reflecting surfaces having therebetween an optical path length of d. The optical path length d is determined by the following:

$$d=L/m,$$

where L is the optical path length of the looped optical path of the ring resonator, and m is a natural number.

Generation of an output optical pulse train 15 by using the optical pulse generator of the second embodiment is described below.

The optical pulse source 6 generates the modulating optical pulse train 13 so that the modulating optical pulse train 13 has a fundamental repetition frequency of f'/n, f' being a circumferential frequency of the main resonator (ring resonator) defined by:

$$f'=c/L,$$

where c is the velocity of light in vacuum, and n being a natural number. The modulating optical pulse train 13 also includes harmonics having repetition rates of 2f'/n, 3f'/n, . . . , f', . . . The modulating optical pulse train 13 is inputted to the semiconductor laser 1 through the semi-transparent mirror 2d, the reflecting mirror 2a, and the collimating lens 5b.

The semiconductor laser 1 generates a resonated pulse train 14 in the ring resonator through passive mode locking. The resonated pulse train 14 is circulated clockwise in the ring resonator to achieve the resonance. The mode of the resonance is determined by the structure of the Fabry-Perot etalon 3 to cause the resonated pulse train 14 to have a repetition rate of m times the circumference frequency f'.

The semiconductor laser 1 is modulated on the basis of the modulating optical pulse train 13, which has the fundamental repetition rate f'/n and includes the harmonics thereof. This causes the resonated optical pulse train 14 to be synchronized with the modulating optical pulse train 13, and also stabilizes the repetition rate of the resonated optical pulse train 14 to m×f'.

The semi-transparent mirror 2d partially transmits the resonated optical pulse train 14 to generate the outputted optical pulse train 15.

It must be understood that the optical pulse train generator of the second embodiment may be modified in the details. For example, the optical isolator 7 may be omitted. The omission of the optical isolator 7 causes optical pulse trains to travel both clockwise and counterclockwise. In this modification, it is preferable that the semiconductor laser 1 includes two gain sections 1a, and the saturable absorber section 1b is disposed between the two gain sections 1a.

Also, one of the reflecting mirrors 2a, 2b, and 2c is replaced by a semi-transparent mirror, and the input of the modulating optical pulse train 13 or the output of the output optical pulse train 15 is achieved through the semi-transparent mirror.

Figure 6A:
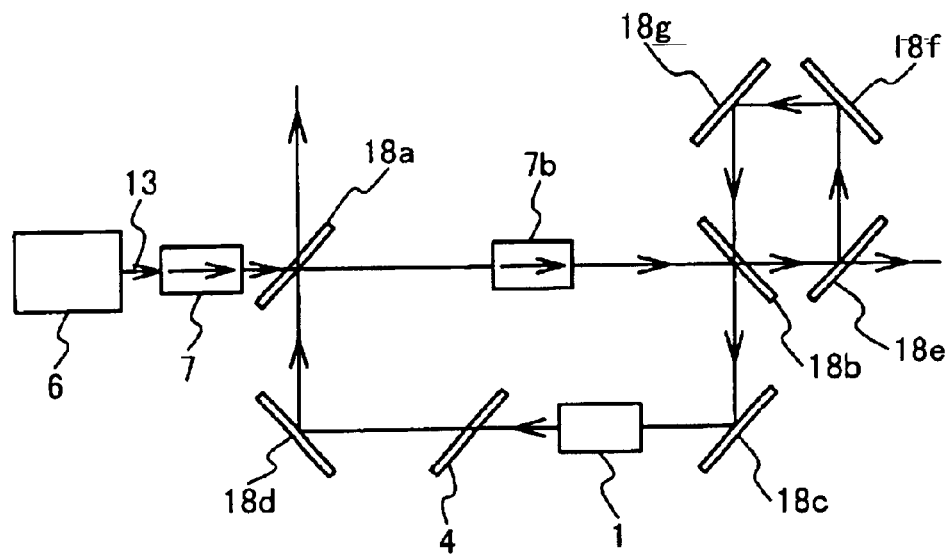
FIG. 6A is a schematic view showing a modified optical pulse generator of the second embodiment.
Figure 6B:
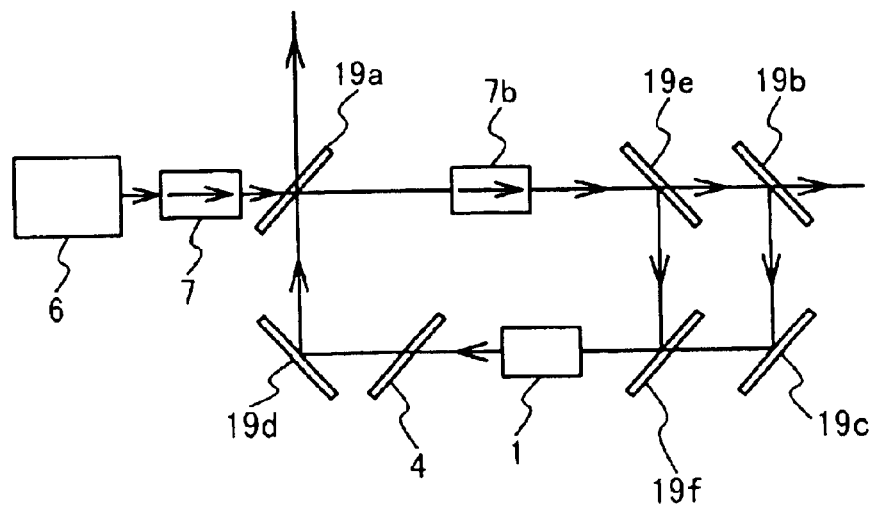
FIG. 6B is a schematic view showing another modified optical pulse generator of the second embodiment.

Furthermore, as shown in FIGS. 6A and 6B, a ring resonator is used as the sub resonator instead of the Fabry-Perot etalon 3. A modified optical pulse train generator shown in FIG. 6A includes a semi-transparent mirror 18a, 18b, 18e, and reflecting mirrors 18c, 18d, 18f, 18g. The semi-transparent mirrors 18a, 18b and the reflecting mirrors 18c, 18d form a main resonator, while the semi-transparent mirrors 18b, 18e, and the reflecting mirrors 18f, 18g form a sub-resonator. Another modified optical pulse train generator shown in FIG. 6B includes semi-transparent mirrors 19a, 19b, 19e, and 19f, and the reflecting mirrors 19c and 19d. The semi-transparent mirrors 19a, 19b and the reflecting mirrors 19c and 19d form a main ring resonator, while the semi-transparent mirrors 19a, 19e, and 19f, and the reflecting mirror 19d form a sub resonator.

Third Embodiment

Figure 7A:
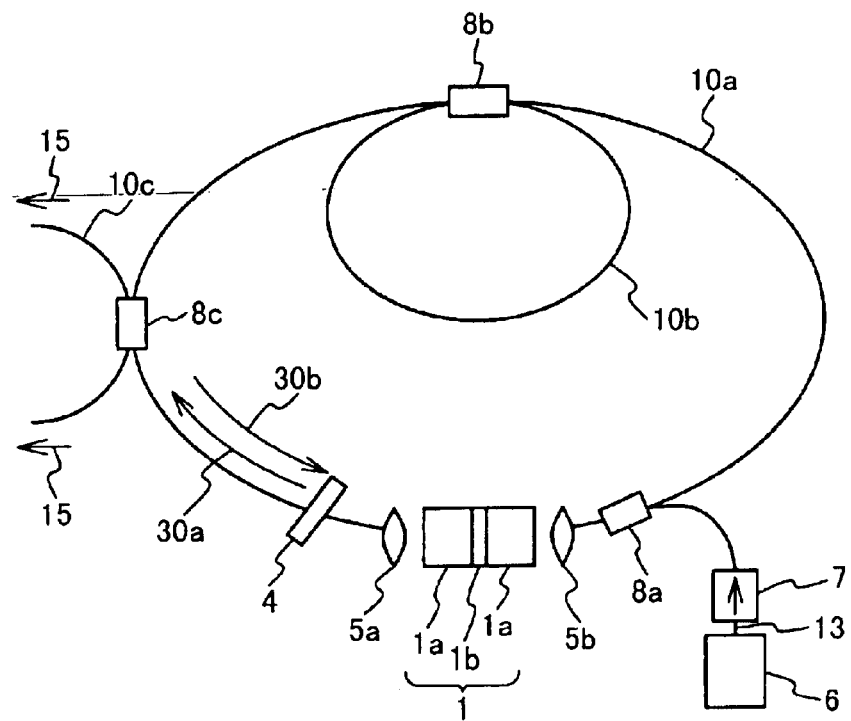
FIG. 7A is a schematic view showing an optical pulse train generator of a third embodiment.

FIG. 7A shows an optical pulse train generator of a third embodiment. In the third embodiment, a ring resonator composed of an optical fiber 10a is used as the main resonator, and a ring resonator composed of a looped optical fiber 10b is used as the sub-resonator.

The main resonator composed of the optical fiber 10a and the sub resonator composed of the looped optical fiber 10b respectively provide looped optical paths. The optical path lengths of the looped optical paths are determined to satisfy the following relation:

$$d=L/m,$$

where L is the optical path length of the main resonator, d is the optical path length of the sub-resonator, and m is a natural number. The looped optical fiber 10b is coupled to the optical fiber 10a with the optical coupler 8b.

An optical coupler 8a is inserted into the optical fiber 10a, through which the modulating optical pulse train 13 is inputted from the optical pulse generator 6 to the main resonator. The optical pulse generator 6 operates in the same as explained in the first and second embodiment.

A semiconductor laser 1 is inserted into the looped optical path of the main resonator. The semiconductor laser 1 includes two gain sections 1a, and a saturable absorber section 1b disposed between the gain sections 1a.

The semiconductor laser 1 generates optical pulse trains 30a and 30b through passive mode locking, the optical pulse train 30a being transmitted clockwise, the optical pulse train 30b being transmitted. The provision of the two gain sections 1a is preferable from the viewpoint of the use of the oppositely transmitted optical pulse trains 30a and 30b. The semiconductor laser 1 is modulated by the modulating optical pulse train 13 to synchronize the optical pulse trains 30a and 30b with the modulating optical pulse train 13. The both ends of the semiconductor laser 1 are respectively coated with antireflection coatings to prevent the formation of undesirable resonators.

The optical pulse trains 30a and 30b are resonated in the main and sob resonators, while the resonance condition is determined by the optical path length d of the sub resonator. The optical pulse trains 30a and 30b have a repetition rate of m times f', where f' is the circumferential frequency determined by:

$$f'=c/L,$$

c being the velocity of light in vacuum.

A wavelength selector 4 is inserted into the optical fiber 10a to fix the wavelengths of the optical pulse trains 30a and 30b. The wavelength selector 4 may be a dispersing prism, a diffraction grating or a wavelength selecting filter composed of layer-structured dielectric layers. The wavelength selector 4 may be replaced with a diffraction grating fiber incorporated with the optical fiber 10a. In this case, an optical isolator is preferably inserted between the incorporated diffraction grating fiber and the semiconductor laser 1. The insertion of the optical isolator effectively prevents the formation of an undesirable resonator between the incorporated diffraction grating fiber and the semiconductor laser 1.

An optical coupler 8c is inserted into the optical fiber 10a to couple an optical fiber 10c to the optical fiber 10a. The optical coupler 8c extracts a portion of the optical pulse trains 30a and 30b to generate output optical pulse trains 15 through the optical fiber 30c. The output optical pulse trains 15 have a high repetition rate of m times f'.

The repetition rate of the output optical pulse trains 15 may be adjusted by applying heat or electric field to the optical fiber 10a. The application of heat or electric field changes the refraction index of the optical fiber 10a and thus changes the optical path length of the optical fiber 10. When the optical fiber 10a is tightly wounded around a piezoelectric element, the adjustment of the repetition rate of the output optical pulse trains 15 may be achieved by applying voltage to the piezoelectric element. The applying voltage to the piezoelectric element changes the length of the optical fiber 10a, and this enables the adjustment of the repetition rate of the output optical pulse trains 15.

The optical pulse train generator of the third embodiment enables to generate optical pulse trains having a high repetition rate while the repetition rate is stabilized.

It must be understood that the optical pulse train generator of the third embodiment may be modified in the details.

Figure 7B:
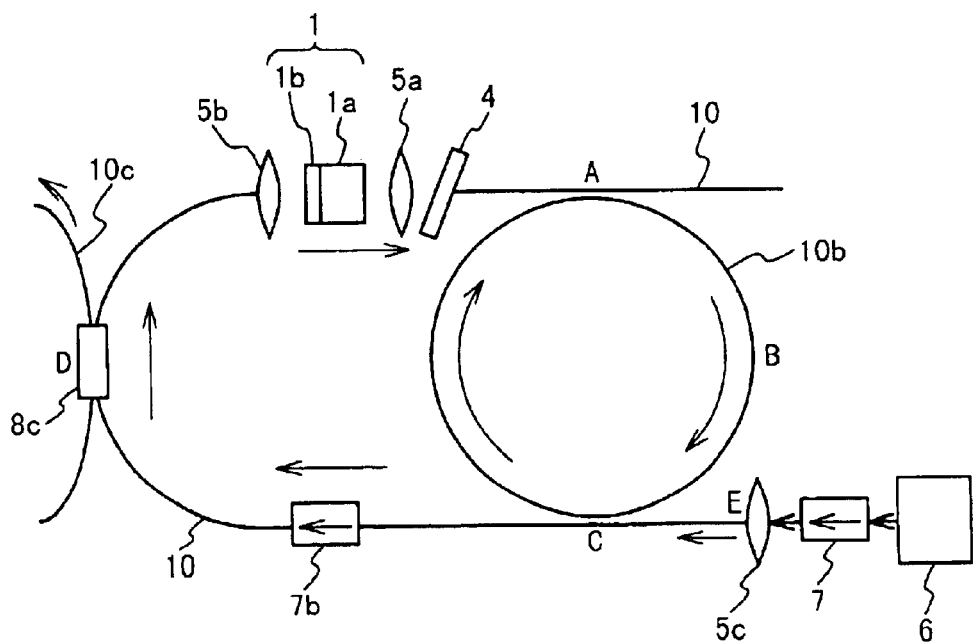
FIG. 7B is a schematic view showing a modified optical pulse train generator of the third embodiment.

FIG. 7B shows a modified optical pulse train generator of the third embodiment. The modified optical pulse train generator is composed of a looped optical fiber 10b, and an optical fiber 10 coupled by optical couplers (not shown) disposed at points A and C to the looped optical fiber 10b. An optical coupler 8c is inserted into the optical fiber 10 at a point D. The optical fiber 10 and 10b forms a main resonator having a looped optical path through points A, B, C and D, the point B being located on the optical fiber 10b. The looped optical fiber 10b independently forms a sub resonator having another looped optical path.

A semiconductor laser 1, a wavelength selector 4 and an optical isolator 7 are inserted into the optical fiber 10. The semiconductor laser 1, a wavelength selector 4 and an optical isolator 7 operate in the same way as explained in the first embodiment.

The optical fiber 10 is optically coupled on the end E thereof to the optical pulse generator 6 through an optical isolator 7 and a coupling lens 5c. The optical pulse generator 6 provides a modulating optical pulse train for the semiconductor laser 1 in the same way as explained in the first embodiment.

The modified optical pulse generator shown in FIG. 7B operates in the same way as that shown in FIG. 7A.

Also, the ring resonators may be formed of semiconductor waveguides. In this case, the main resonator is formed of a looped ridge waveguide composed of a clad layer, a waveguide layer and another clad layer serially layered on a semiconductor substrate. A mode-locked semiconductor laser is monolithically incorporated with the looped ridge waveguide on the semiconductor substrate. The mode-locked semiconductor laser is provided with a DBR (Distributed Bragg Reflector) section, a gain section connected to the DBR section, an absorption absorber section connected to the gain section, and another gain section connected to the absorption absorber section. The DBR section functions as a wavelength selector for selecting a wavelength of an optical pulse train generated in the ring resonators. The sub resonator is formed of another looped semiconductor waveguide. The sub resonator is optically coupled to the main resonator with a Y blanch or a directional optical coupler. The optical path length d of the looped optical path of the sub resonator is determined to satisfy the following:

$$d=L/m,$$

where L is the optical path length of the looped optical path of the main resonator, and m is a natural number.

The main resonator is provided with first and second Y blanched waveguides. The first Y blanched waveguide is used for inputting a modulating optical pulse train from an optical pulse generator. The optical pulse generator is coupled to an end of the first Y blanched waveguide. The optical pulse generator includes a mode-locked semiconductor laser composed of a gain section and a saturable absorber section. The mode-locked semiconductor laser is monolithically integrated on the semiconductor substrate. The second Y blanched waveguide is used for extracting a portion of an optical pulse train circulated in the main resonator.

In this modification, a Fabry-Perot etalon may be used as the sub resonator instead of the ring resonator. In this case, the Fabry-Perot etalon is buried in a groove formed across the looped waveguide of the main resonator.

Also, in this modification, the DBR section of the mode-locked semiconductor laser is replaced with a wavelength selector buried in a groove formed across the looped waveguide of the main resonator.

Also, in this modification, an optical isolator is inserted to the main resonator to cause the generated optical pulse train to be transmitted in one of the clockwise and counterclockwise directions. The optical isolator may include an isolator utilizing the Faraday rotation or an isolator formed with semiconductor.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An optical pulse train generator comprising:
   a first optical resonator having therein a first optical path of a first optical path length;
   a second optical resonator inserted into said first optical path, wherein said second optical resonator has therein a second optical path of a second optical path length substantially equal to 1/m of said second optical path length, m being a natural number;
   an optical pulse generator providing said first optical resonator with a first optical pulse train including a component of a first repetition rate tuned corresponding to said first optical path length,
   wherein the provision of said first optical pulse train allows a second optical pulse train to be generated in said first optical resonator,
   wherein said first optical resonator extracts a portion of said second optical pulse train to output an output optical pulse train.

2. The optical pulse train generator according to claim 1, further comprising:
   a laser gain element inserted into said first optical path of said first optical resonator, wherein said laser gain element receives said first optical pulses for amplifying said second optical pulse train in synchronization with said first optical pulses.

3. The optical pulse train generator according to claim 2, wherein said laser gain element is a mode-locked semiconductor laser including:
   a saturable absorber region receiving said first optical pulses, and
   a gain region coupled to said saturable absorber region to amplify said second first optical pulses.

4. The optical pulse train generator according to claim 3, wherein said mode-locked semiconductor laser has a reflecting surface on said saturable absorber region, and
   wherein said first optical resonator includes a reflecting mirror, and
   wherein said first optical path is formed between said reflecting surface and said mirror through said gain region and said second optical resonator.

5. The optical pulse train generator according to claim 4, wherein said reflecting mirror is movably designed to enable to adjust said first optical path length.

6. The optical pulse train generator according to claim 2, wherein said first optical resonator is formed of a Fabry-Perot resonator having a pair of reflecting surfaces between which said first optical path is formed.

7. The optical pulse train generator according to claim 6, wherein said first repetition rate of the first optical pulse train is f/n, n being a natural number and f being a circumferential frequency defined by:

$$f=c/2L,$$

where c is the velocity of light in vacuum, and L is said first optical path length of said first optical path between said pair of reflecting surface, and
   wherein said second repetition rate of the second optical pulse train is m times said circumferential frequency.

8. The optical pulse train generator according to claim 6, wherein said second optical resonator is formed of a Fabry-Perot etalon including a pair of optical flats between which said second optical path is formed.

9. The optical pulse train generator according to claim 8, wherein said Fabry-Perot resonator and said Fabry-Perot etalon are designed not to form a resonator between said Fabry-Perot resonator and said Fabry-Perot etalon.

10. The optical pulse train generator according to claim 9, wherein said pair of optical flats is oblique to said first optical path formed between said pair of reflecting mirrors of said Fabry-Perot resonator.

11. The optical pulse train generator according to claim 1, wherein said first optical resonator is formed of a ring resonator, the first optical path of said first optical resonator being looped.

12. The optical pulse train generator according to claim 11, wherein said first repetition rate of the first optical pulse train is f'/n, n being a natural number and f' being a circumferential frequency defined by:

$$f'=c/L,$$

where c is the velocity of light in vacuum, and L is said first optical path length of said looped first optical path, and
   wherein said second repetition rate of the second optical pulse train is m times said circumferential frequency.

13. The optical pulse train generator according to claim 11, wherein said first optical resonator includes an optical fiber to form said ring resonator.

14. The optical pulse train generator according to claim 11, wherein said second optical resonator is formed of a Fabry-Perot etalon.

15. The optical pulse train generator according to claim 11, wherein said second optical resonator is formed of another ring resonator, said second optical path of said second optical resonator being looped.

16. The optical pulse train generator according to claim 15, wherein said second optical resonator includes another optical fiber to form said another ring resonator.

17. The optical pulse train generator according to claim 16, wherein said first optical path length of said first optical resonator is adjustable.

18. The optical pulse train generator according to claim 16, wherein said second optical path length of said second optical resonator is adjustable.

* * * * *